United States Patent
Yang

(10) Patent No.: US 7,142,836 B2
(45) Date of Patent: Nov. 28, 2006

(54) MICROWAVE FILTER DISTRIBUTED ON CIRCUIT BOARD OF WIRELESS COMMUNICATION PRODUCT

(75) Inventor: Kuei Chi Yang, Hsinchu (TW)

(73) Assignee: Alpha Networks Inc., Hsinchu (TW)

( * ) Notice: Subject to any disclaimer, the term of this patent is extended or adjusted under 35 U.S.C. 154(b) by 428 days.

(21) Appl. No.: 10/724,067

(22) Filed: Dec. 1, 2003

(65) Prior Publication Data

US 2005/0118978 A1   Jun. 2, 2005

(51) Int. Cl.
*H04B 1/10* (2006.01)
(52) U.S. Cl. ............... 455/307; 455/213; 455/309; 455/339; 333/204; 333/202
(58) Field of Classification Search ............ 333/995, 333/204; 505/210; 455/307, 213, 309, 339
See application file for complete search history.

(56) References Cited

U.S. PATENT DOCUMENTS

| | | | |
|---|---|---|---|
| 5,530,637 A * | 6/1996 | Fujita et al. | 363/126 |
| 6,608,537 B1 * | 8/2003 | Kanba et al. | 333/204 |
| 6,653,917 B1 * | 11/2003 | Kang et al. | 333/99 S |
| 6,823,201 B1 * | 11/2004 | Kai et al. | 505/210 |
| 6,897,724 B1 * | 5/2005 | Gurvich et al. | 330/151 |

* cited by examiner

*Primary Examiner*—Quochien B. Vuong
*Assistant Examiner*—Richard Chan
(74) *Attorney, Agent, or Firm*—Bacon & Thomas, PLLC

(57) ABSTRACT

The present invention is to provide a microwave filter distributed on a circuit board of a wireless communication product, which comprises an input terminal, a resonant chamber of double frequencies, and an output terminal of the microwave filter directly distributed on the circuit board of the wireless communication product as a plurality of microstrips by utilizing a manufacturing technique of printed circuit board for eliminating the harmonic spurious of double frequencies and higher frequency caused by nonlinear distortion of a power amplifier of the wireless communication product.

3 Claims, 5 Drawing Sheets

MICROWAVE FILTER DISTRIBUTED ON CIRCUIT BOARD OF WIRELESS COMMUNICATION PRODUCT

FIELD OF THE INVENTION

The present invention relates to wireless communication products and more particularly to an improved microwave filter distributed on the circuit board of a wireless communication product.

BACKGROUND OF THE INVENTION

Over the past several years there has been a simultaneous growth in the wireless communication product market, leading to an increasing use of WLAN (wireless local area network). One particularly important thing was the publication of IEEE 802.11 WLAN protocol in 1997. The WLAN protocol not only provides many novel features of WLAN communication but also provides a solution for communicating among various wireless communication products. This is a milestone for the development of WLAN. The WLAN protocol also ensures a solution of performing a single chip by means of core device and greatly reduces the cost of employing wireless technique. As a result, WLAN is readily adapted to employ in a variety of wireless communication products.

When a wireless communication product is transmitting data wirelessly in a high power state, electromagnetic wave is generated and may in turn cause EMI (electromagnetic interference). For solving this problem many modern countries have stipulated some related rules in order to limit the import and the use of wireless communication products not complying with the related rules. In order to comply with the rules, many designers and manufacturers of wireless communication product have to redesign the control circuit of the wireless communication product. Typically, they add a filter next to a power amplifier for eliminating the harmonic spurious of high frequency. As an end, the harmonic of high frequency of the wireless communication product being produced is adapted to comply with the EMI correction rule. However, the filter, mounted in the control circuit of the wireless communication product being designed and manufactured by the manufacturers, is responsible for only eliminating the harmonic of double frequencies generated by the wireless communication product. This is best illustrated in the graph of FIG. 1 in which the measurement result of filtering a wireless communication product having a signal transmission frequency of 5.5 GHz is shown. An insertion loss about 0.1 dB, a reduction about 35.8 dB at the harmonic of double frequencies of 11 GHz, and a poor reduction about 7.17 dB at the harmonic of triple frequency of 16.5 GHz are also shown. A high frequency filter having a higher insertion loss is required if it is desired to eliminate both the harmonic spurious of double frequencies and the harmonic spurious of even higher frequency at the same time. However, the high frequency filters are expensive and bulky, thus contradicting the trend of designing a lightweight, compact, and portable electronic products. In view of the above, the installation of the high frequency filter is not desired due to the greatly increased manufacturing cost and size.

The harmonic generated by a wireless communication product in transmitting high power signals will be the major reason causing the product difficult to pass though the EMI test being conducted. Particularly, the harmonic of double frequencies and the harmonic of higher frequency of the signal transmission frequency are even harder to pass though the EMI test.

Thus, it is desirable among many designers and manufacturers to design wireless communication products to comply with the stipulated rule without greatly increasing the manufacturing cost and the size in order to overcome the above drawbacks of the prior art.

SUMMARY OF THE INVENTION

A primary object of the present invention is to provide a microwave filter distributed on a circuit board of a wireless communication product. By utilizing the present invention, the above drawback of the prior art can be overcome. The drawback is that an expensive and bulky high frequency filter having a higher insertion loss is required if it is desired to eliminate both the harmonic spurious of double frequencies and the harmonic spurious of even higher frequency at the same time.

One object of the present invention is to directly distribute microwave circuits containing an input terminal, a resonant chamber of double frequencies, and an output terminal of a microwave filter on a circuit board of a wireless communication product to be produced by utilizing the manufacturing technique of printed circuit board. The produced microwave filter is able to eliminate the harmonic spurious of double frequencies and the harmonic spurious of higher frequency caused by nonlinear distortion of a power amplifier of the wireless communication product. By utilizing the present invention, it is possible of greatly reducing the manufacturing cost of the wireless communication product and substantially eliminating EMI caused by the wireless communication product in operation.

Another object of the present invention is to distribute the microstrip circuit at the input terminal and the resonant chamber of double frequencies on a top layer of the circuit board, distribute the resonant chamber of double frequencies and the microstrip circuit at the output terminal on a bottom layer of the circuit board, configure the top and bottom layers as transmission surfaces of RF signal, and interconnect the microstrip circuits at the top and bottom layers by means of two through vias in the circuit board. Also, a first ground is provided in the circuit board proximate the top layer containing the input terminal and the resonant chamber of double frequencies of the microstrip circuit. The first ground is used as a reference ground of the input terminal and the resonant chamber of double frequencies of the microstrip circuit. Moreover, a second ground is provided in the circuit board proximate the bottom layer containing the output terminal of the microstrip circuit. The second ground is used as a reference ground of the output terminal of the microstrip circuit. Thus, the microwave filter of the present invention is adapted to utilize the unused area on the circuit board to distribute a required microstrip circuit thereon and eliminate the harmonic spurious of double frequencies and the harmonic spurious of higher frequency without greatly increasing the manufacturing cost and the size of the wireless communication product as experienced by the prior art.

The above and other objects, features and advantages of the present invention will become apparent from the following detailed description taken with the accompanying drawings.

DETAILED DESCRIPTION OF THE PREFERRED EMBODIMENTS

Figure 1:
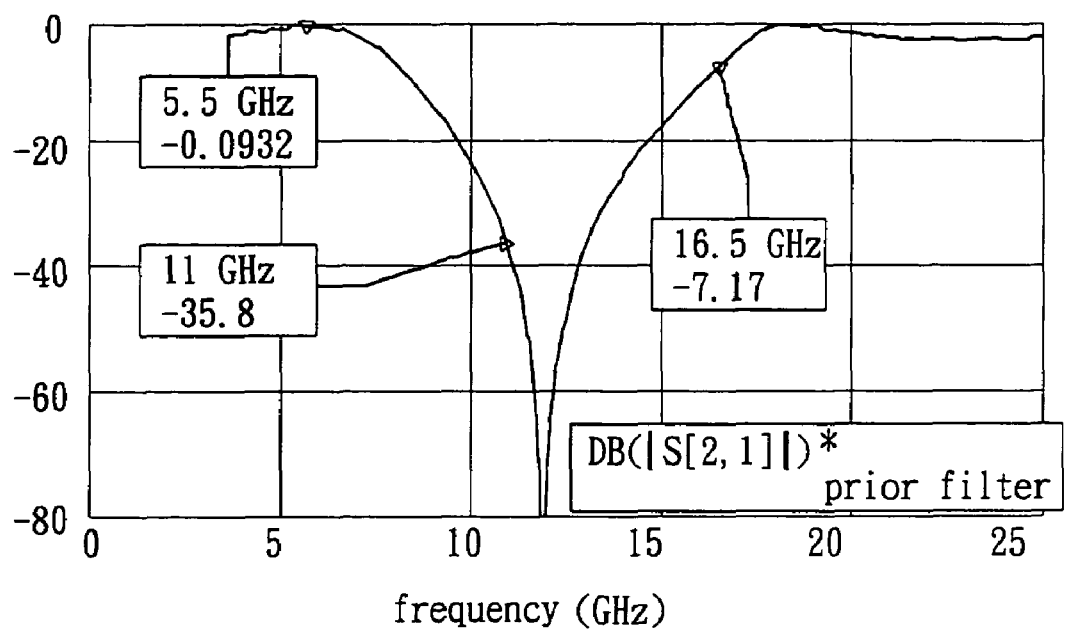
FIG. 1 is a frequency response graph showing the measurement result of filtering a well known wireless communication product having a signal transmission frequency of 5.5 GHz.
Figure 2:
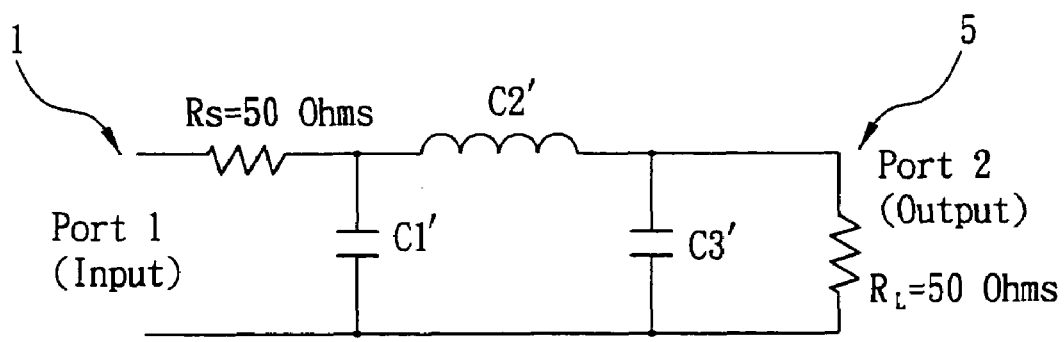
FIG. 2 is an equivalent circuit diagram of a π-section, low pass filter.

A first preferred embodiment of the invention directly distributes microwave circuits containing an input terminal, a resonant chamber of double frequencies, and an output terminal of a microwave filter on a circuit board of a wireless communication product to be produced by means of microstrip by utilizing the manufacturing technique of printed circuit board. The produced microwave filter is able to eliminate the harmonic spurious of double frequencies and the harmonic spurious of higher frequency caused by nonlinear distortion of a power amplifier of the wireless communication product. A π-section, low pass filter having an equal ripple of 0.5 dB is used as the prototype in designing the microwave filter of the invention. As shown in the equivalent circuit of FIG. 2, resistor value of resistor $R_s$ in input terminal 1 or resistor $R_L$ in output terminal 5 is 50 Ohms. Also, $g_1$=1.5963, $g_2$=1.0967, $g_3$=1.5963, and $g_4$=1 by referring to David M. Pozar "Microwave Engineering" 2nd edition, John Wiley & Sons, Inc., 1998. In addition, we have the following two equations:

$$C_{K'}=C_K/(R_0\omega_C)$$

$$L_{K'}=(R_0L_K)/\omega_C$$

The equivalent capacitance and inductance of a lumped element are as follows:

$$C_{1'}=g_1/(50*2\pi*5.5\ \text{GHz})=0.9239\ (\text{pF})$$

$$L_{2'}=(50*g_2)/(2\pi*5.5\ \text{GHz})=1.587\ (nH)$$

$$C_{3'}=g_3/(50*2\pi*5.5\ \text{GHz})=0.9239\ (\text{pF})$$

$$R_0=g_4*50=50\ (\text{Ohms})$$

The equivalent circuit of distributed elements of the microstrip circuit is as follows:

$$z_C=1/C_k$$

$$z_L=L_k$$

where $$z_1=1/C_1=1/g_1=0.6264$$

$$z_2=L_2=g_2=1.0967$$

$$z_3=1/C_3=1/g_3=0.6264$$

As an end, impedance values $Z_1$, $Z_2$, and $Z_3$ of the microstrip circuit are as follows:

$$Z_1=z_1*R_0=31.32\ (\text{Ohms})$$

$$Z_2=z_2*R_0=54.835\ (\text{Ohms})$$

$$Z_3=z_3*R_0=31.32\ (\text{Ohms})$$

Figure 3:
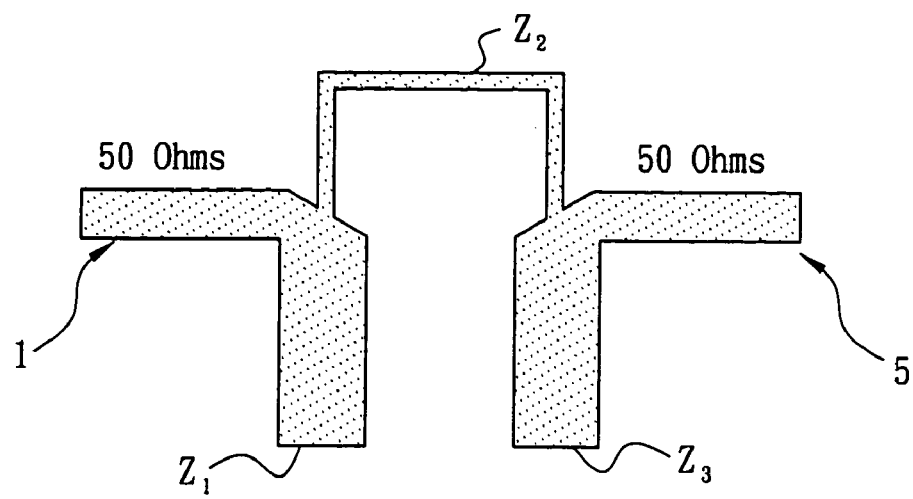
FIG. 3 is a schematic diagram of the microstrip circuit of the low pass filter shown in FIG. 2.
Figure 4:
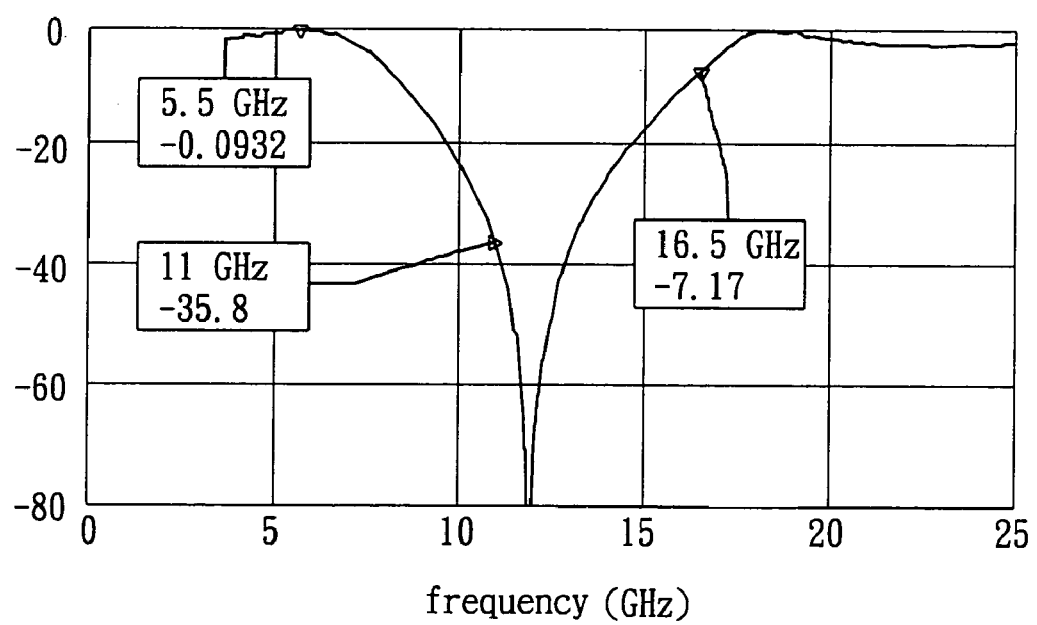
FIG. 4 is a frequency response graph showing the measurement result of filtering a wireless communication product by means of the low pass filter shown in FIG. 3.

The microstrip circuit of a formed low pass filter having the above impedance values is shown in FIG. 3. One end of the microwave circuit at input terminal 1 is perpendicular to one end of the coupled first microstrip circuit $Z_1$. One end of the microwave circuit at output terminal 5 is perpendicular to one end of the coupled third microstrip circuit $Z_3$. The first microstrip circuit $Z_1$ is parallel to the third microstrip circuit $Z_3$. A second microstrip circuit $Z_2$ is interconnected the first microstrip circuit $Z_1$ and the third microstrip circuit $Z_3$ in a meandering path. As seen, the second microstrip circuit $Z_2$ is shaped as an inverted U. Next, feed the transmission signals of high power generated by the wireless communication product to the input terminal 1 of the low pass filter. A frequency response at the output terminal 5 is shown in the graph of FIG. 4. It is seen clearly from the frequency response graph of FIG. 4 that an insertion loss is about 0.1 dB, a reduction about 35.8 dB at the harmonic of double frequencies of 11 GHz, and a reduction about 7.17 dB at the harmonic of triple frequency of 16.5 GHz. These measurements are about the same as that measured in a well known filter. Particularly, the elimination of the harmonic spurious of triple frequency is not acceptable.

Figure 5:
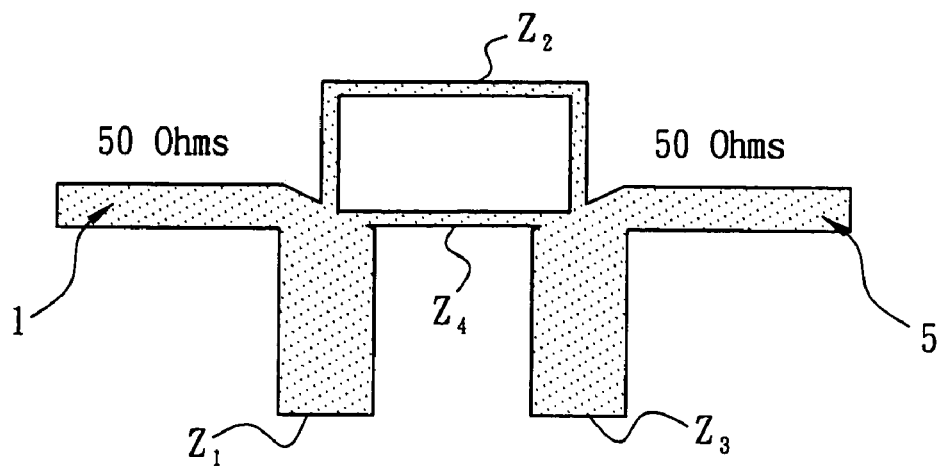
FIG. 5 is a schematic diagram of the microstrip circuit of a low pass filter according to a first preferred embodiment of the invention.
Figure 6:
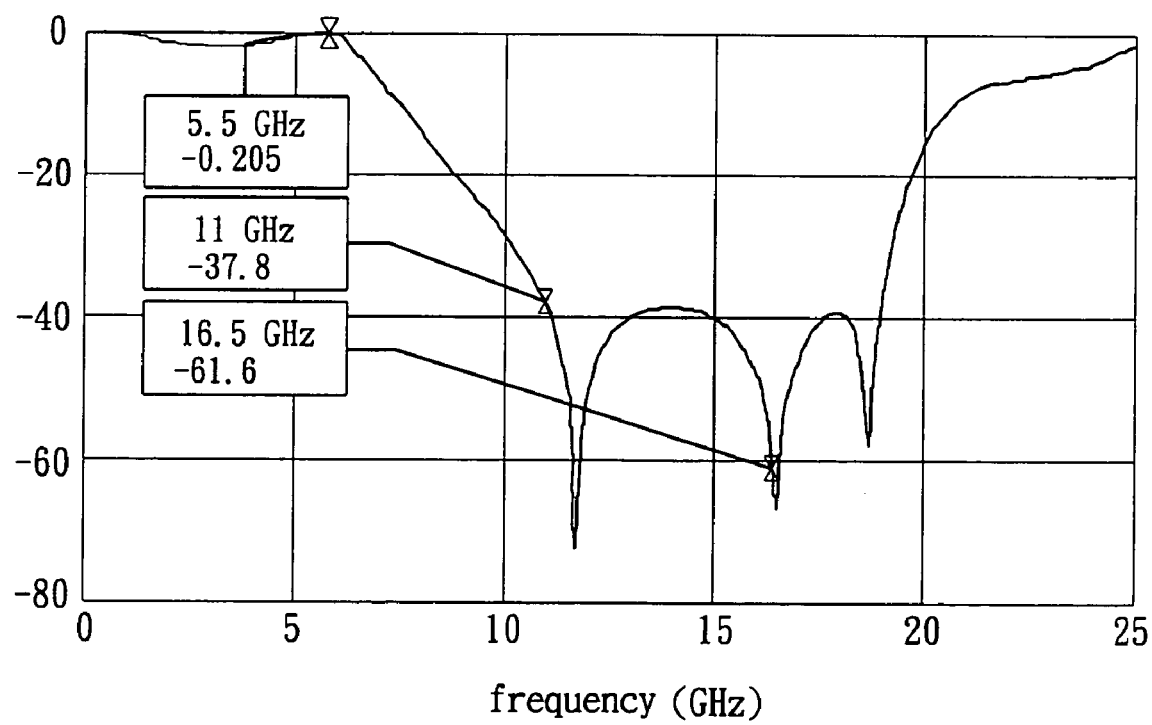
FIG. 6 is a frequency response graph showing the measurement result of filtering a wireless communication product by means of the low pass filter shown in FIG. 5.

In view of the above, the present inventor devises a fourth microstrip circuit $Z_4$ parallel to the second microstrip circuit $Z_2$. Further, the fourth microstrip circuit $Z_4$ is interconnected the first microstrip circuit $Z_1$ and the third microstrip circuit $Z_3$ and is perpendicular to either one of the first microstrip circuit $Z_1$ and the third microstrip circuit $Z_3$. A microwave filter as shown in FIG. 5 is formed by suitably adjusting the length and the impedance of the third microstrip circuit $Z_4$. A resonant chamber of double frequencies of the microwave filter is comprised of the first, the second, the third, and the fourth microstrip circuits $Z_1$, $Z_2$, $Z_3$, and $Z_4$. Next, the transmission signals of high power generated by the wireless communication product is fed to the input terminal 1. A frequency response at the output terminal 5 is then measured and is depicted in the graph of FIG. 6. It is seen clearly from the frequency response graph of FIG. 6 that an insertion loss is about 0.2 dB, a reduction about 37.8 dB at the harmonic of double frequencies of 11 GHz, and a reduction about 61.6 dB at the harmonic of triple frequency of 16.5 GHz. That is, it is possible of eliminating the harmonic spurious of double frequencies and the harmonic spurious of higher frequency at the same time.

In a second preferred embodiment of the invention the microwave circuit only occupies an unused area of the circuit board in order to utilize the precious area of the circuit board. Otherwise, the area of the circuit board has to increase undesirably. The microstrip circuit on the microwave filter is divided into two portions in which one portion comprises the input terminal 1, the first microstrip circuit $Z_1$, and the second microstrip circuit $Z_2$, and the other portion comprises the third microstrip circuit $Z_3$, the fourth microstrip circuit $Z_4$, and the output terminal 5. These two portions are located at the top layer and the bottom layer of the circuit board respectively and are used as transmission surfaces of RF (radio frequency) signal. Finally, two through vias are provided to interconnect the portions.

Figure 7:
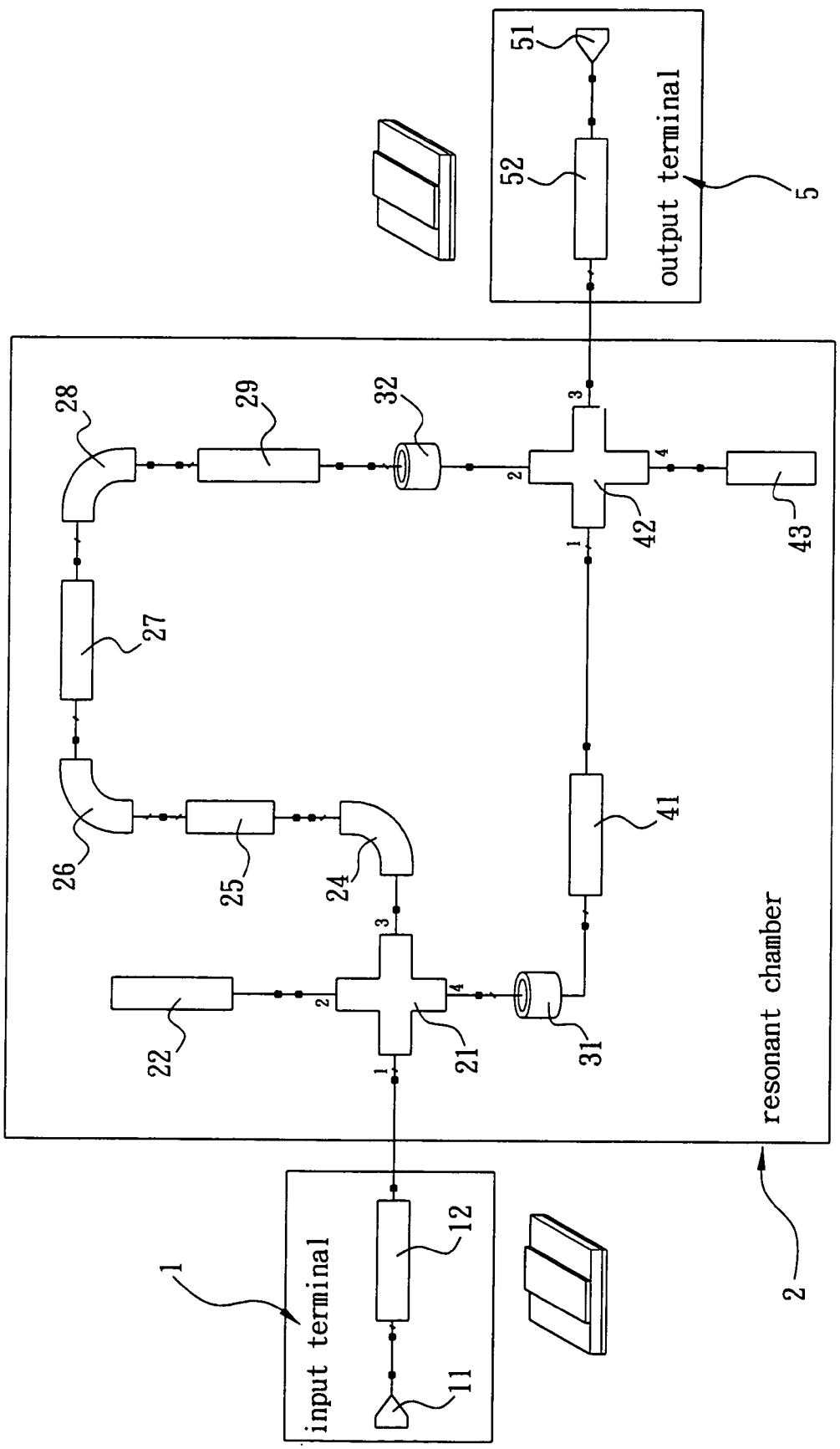
FIG. 7 schematically depicts a structure formed by emulating the FIG. 5 low pass filter by means of a waveguide element.

For embodying the above concept, the present inventor emulates the microwave filter of FIG. 5 by means of a waveguide element. The emulated structure is shown in FIG. 7. The structure is implemented as a microstrip circuit including an input terminal 1, a resonant chamber of double frequencies 2, and an output terminal 5. The input terminal 1 comprises a first microstrip line 12 having one end coupled to an input port 11 and the other end coupled to a first microstrip cross component 21 of the resonant chamber of double frequencies 2. The remaining three ends of the first microstrip cross component 21 are coupled to a first end effect component 22, a first microstrip meander component 24, and a first microstrip via hole 31 respectively. The other end of the first microstrip meander component 24 is coupled to a second microstrip line 25, a second microstrip meander component 26, a third microstrip line 27, a third microstrip meander component 28, a fourth microstrip line 29, a second microstrip via hole 32, and a second microstrip cross component 42 in series. The first microstrip via hole 31 is coupled to the second microstrip cross component 42 via a fifth microstrip line 41. The remaining two ends of the second microstrip cross component 42 are coupled to a second end effect component 43 and a sixth microstrip line 52 respectively. The other end of the sixth microstrip line 52 is coupled to an output port 51. This forms the output terminal 5 of the microwave filter. In the structure, the microstrip circuit at one side of the first microstrip via hole 31 and the second microstrip via hole 32 is electrically coupled to ground of an RF signal line. The microstrip circuit at the other side of the first microstrip via hole 31 and the second microstrip via hole 32 is electrically coupled to ground of another RF signal line. Hence, it is possible of causing the microwave filter to resonate at a frequency range of double frequencies to triple frequency of the signal transmitted from a wireless communication product. As an end, it is possible of substantially eliminating both the harmonic spurious of double frequencies and the harmonic spurious of triple frequency of the signal transmission frequency.

Figure 8:
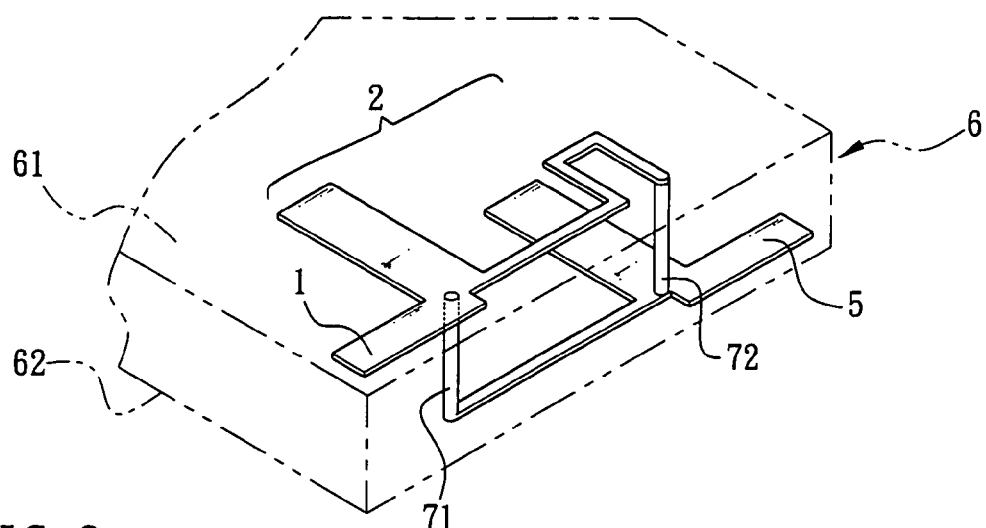
FIG. 8 schematically shows the microstrip circuit of a low pass filter according to a second preferred embodiment of the invention.
Figure 9:
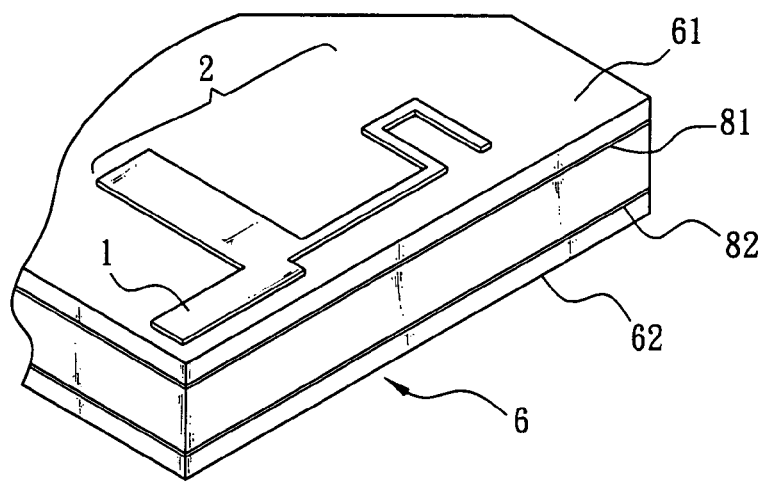
FIG. 9 is a perspective view of the circuit board of a wireless communication product having the FIG. 8 microwave filter distributed thereon viewed above the circuit.
Figure 10:
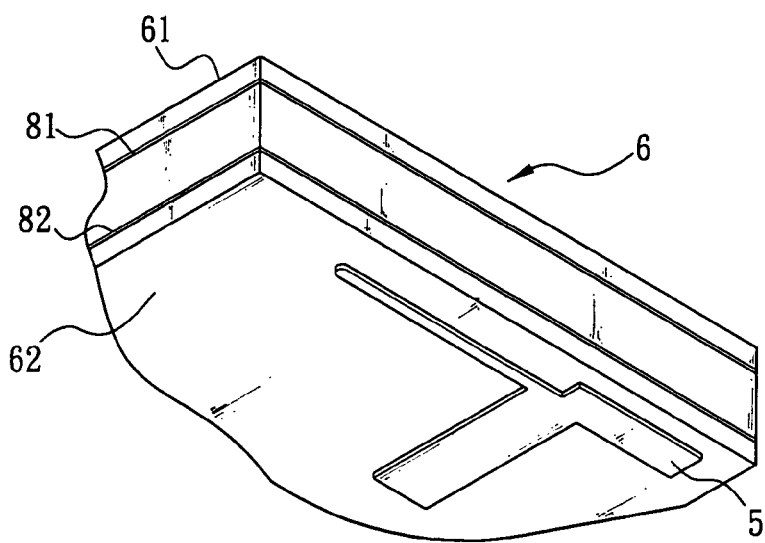
FIG. 10 is a perspective view of the circuit board of the wireless communication product having the FIG. 8 microwave filter distributed thereon viewed under the circuit.

As such, the microstrip circuit of FIG. 7 is directly distributed on a circuit board 6 of a wireless communication product by utilizing the manufacturing technique of printed circuit board. Referring to FIGS. 8, 9, and 10, a portion of the microstrip circuit at the input terminal 1 and the resonant chamber of double frequencies 2 are distributed on a top layer 61 of the circuit board 6, and another portion of the resonant chamber of double frequencies 2 and the microstrip circuit at the output terminal 5 are distributed on a bottom layer 62 of the circuit board 6 in which the layers 61 and 62 are used as transmission surfaces of RF signal. Finally, two through vias 71 and 72 in the circuit board 6 are provided to interconnect the microstrip circuits at the layers 61 and 62. Ground 81 is provided in the circuit board 6 proximate the top layer 61 containing the input terminal 1 and the resonant chamber of double frequencies 2 of the microstrip circuit. The ground 81 is used as a reference ground of the input terminal 1 and the resonant chamber of double frequencies 2 of the microstrip circuit. Likewise, another ground 82 is provided in the circuit board 6 proximate the bottom layer 62 containing the output terminal 5 of the microstrip circuit. The ground 82 is used as a reference ground of the output terminal 5 of the microstrip circuit. In such a manner, the microwave filter constructed according to the second preferred embodiment of the invention is adapted to utilize the unused area on the circuit board 6 to distribute a required microstrip circuit thereon and eliminate both the harmonic spurious of double frequencies and the harmonic spurious of higher frequency without greatly increasing the manufacturing cost and the size of the wireless communication product.

While the invention has been described by means of specific embodiments, numerous modifications and variations could be made thereto by those skilled in the art without departing from the scope and spirit of the invention set forth in the claims.

What is claimed is:

1. A microwave filter distributed on a circuit board of a wireless communication product, comprising an input terminal, a resonant chamber of double frequencies, and an output terminal of the microwave filter directly distributed on the circuit board of the wireless communication product as a plurality of microstrips by utilizing a manufacturing technique of printed circuit board, wherein a microstrip circuit of the resonant chamber of double frequencies comprises:
    a first microstrip circuit having one end perpendicularly coupled to one end of the input terminal;
    a third microstrip circuit having one end perpendicularly coupled to one end of the input terminal, the third microstrip circuit being parallel to the first microstrip circuit;
    a second microstrip circuit interconnected the first microstrip circuit and the third microstrip circuit in a meandering path and being perpendicular to each of the first and the third micro strip circuits; and
    a fourth microstrip circuit interconnected the first microstrip circuit and the third microstrip circuit and being disposed across the first and the third microstrip circuits, wherein the input terminal of the microstrip circuit, the first microstrip circuit, and the second microstrip circuit are provided at a top layer of the circuit board, the third microstrip circuit, the fourth microstrip circuit, and the output terminal of the microstrip circuit are provided at a bottom layer of the circuit board, and two through vias are provided on the circuit board for interconnecting the top and the bottom layers of the circuit board.

2. The microwave filter of claim 1, further comprising a first layer in the circuit board proximate the input terminal of the microstrip circuit, the first layer being served as a reference ground of the input terminal of the microstrip circuit, the first microstrip circuit, and the second microstrip circuit, and a second ground in the circuit board proximate the output terminal of the microstrip circuit, the second layer being served as a reference ground of the third microstrip circuit, the fourth microstrip circuit, and the output terminal of the microstrip circuit.

3. The microwave filter of claim 2, wherein the second microstrip circuit is shaped as an inverted U across the first and the third microstrip circuits.

* * * * *